United States Patent [19]
Arase

[11] Patent Number: 5,812,457
[45] Date of Patent: Sep. 22, 1998

[54] SEMICONDUCTOR NAND TYPE FLASH MEMORY WITH INCREMENTAL STEP PULSE PROGRAMMING

[75] Inventor: Kenshiro Arase, Kanagawa, Japan

[73] Assignee: Sony Corporation, Japan

[21] Appl. No.: 925,662

[22] Filed: Sep. 9, 1997

[30] Foreign Application Priority Data

Sep. 9, 1996 [JP] Japan ................................. 8-238206
Sep. 9, 1996 [JP] Japan ................................. 8-238208

[51] Int. Cl.$^6$ ................................. G11C 16/06
[52] U.S. Cl. ........................ 365/185.22; 365/185.18; 365/185.17; 365/185.19
[58] Field of Search ................... 365/185.22, 185.18, 365/185.17, 185.28, 185.19

[56] References Cited

U.S. PATENT DOCUMENTS

| | | | |
|---|---|---|---|
| 5,379,256 | 1/1995 | Tanaka et al. | 365/185.22 |
| 5,477,499 | 12/1995 | Van Buskirk et al. | 365/185.22 |
| 5,487,033 | 1/1996 | Keeney et al. | 365/185.19 |

*Primary Examiner*—Huan Hoang
*Attorney, Agent, or Firm*—Ronald P. Kananen

[57] ABSTRACT

A semiconductor nonvolatile memory device enabling high speed, high precision data programming and have a large disturb margin, that is, a NAND type flash memory wherein the programming operation is performed by repeating a programming operation a plurality of times through a verify read operation, where the programming word line voltages VPP1 to VPPk and an intermediate prohibit voltage VM1 to Vmk are set to values which are incremented along with an increase of the number k of programming and where the voltage increments of the intermediate prohibit voltage for each increase of the number of programming is set to half of the voltage increments of the programming word line voltage for each increase of the number of programming. Due to this, high speed, high precision data programming becomes possible and further the degradation of the disturb margin can be eliminated.

16 Claims, 13 Drawing Sheets

SEMICONDUCTOR NAND TYPE FLASH MEMORY WITH INCREMENTAL STEP PULSE PROGRAMMING

BACKGROUND OF THE INVENTION

1. Field of the Invention

The present invention relates to an electrically programmable semiconductor nonvolatile memory device, and more particularly relates to a data programming type circuit in a NAND type flash memory or other semiconductor nonvolatile memory device for programming data by injecting electrons into a floating gate using the Fowler-Nordheim (hereinafter referred to as "FN") tunnel phenomenon.

2. Background of the Invention

Conventionally, the mainstream in electrically programmable read only memories (EPROMs), flash memories, and other semiconductor nonvolatile memory devices has been NOR type semiconductor nonvolatile memory devices which perform the programming of data by injecting electrons into a floating gate by an injection of channel hot electrons (hereinafter referred to as "CHE").

In the above NOR type semiconductor nonvolatile memory devices, however, a large current is required at the time of CHE data programming, it is difficult to supply this current from an on-chip boosting circuit, and, if the power supply voltage becomes lower in the future, it is expected to become difficult to operate the semiconductor nonvolatile memory device by a single power supply.

In addition, in such NOR type semiconductor nonvolatile memory devices, it was only possible to program data in units of bytes, that is, for about eight memory transistors at one time, due to the above restrictions in current. This was a great limitation in terms of the speed of the programming.

From the above viewpoint, a semiconductor nonvolatile memory device for performing the programming of data by injecting electrons into a floating gate by the FN tunnel phenomenon, for example, a NAND type flash memory, has been proposed.

FIG. 1 is a view of the structure of a memory array in a NAND type flash memory.

The NAND type flash memory of FIG. 1 is, for convenience, shown as a memory array comprised of four memory transistors connected to one NAND string connected to one bit line.

In FIG. 1, BL denotes a bit line. To this bit line BL is connected a NAND string to which two selection transistors ST1 and ST2 and four memory transistors MT1 to MT4 are connected in series.

The selection transistors ST1 and ST2 are respectively controlled by selection gate lines SL1 and SL2, while the memory transistors MT1 to MT4 are respectively controlled by word lines WL1 to WL4.

In the programming operation of such a NAND type flash memory, the operating current at the time of data programming is small, so there is the advantage that it is relatively easy to supply this current from an on-chip boosting circuit and operation with a single current is easy.

Further, in a NAND type flash memory, it is possible to perform the data programming in units of "pages", that is, for all of the memory transistors connected to the selected word line all at once, due to the superiority of the above operating current. As a natural result, it is superior in terms of the speed of programming.

Further, in the above NAND type flash memory, even if the programming characteristics differ among memory transistors due to variations in the process, since the programming operation is carried out repeatedly via a verify read operation, there is the advantage that differences in the programming threshold voltage Vth are suppressed.

That is, when page programming is carried out for all of the memory transistors connected to a selected word line all at once, by transferring the page programming data to a data latch circuit for every bit line and successively inverting the latch data of the programming finished cell to set the cell in a state where programming is prohibited by carrying out verify operation for every bit, excessive programming is prevented, and differences in the programming threshold voltage Vth are suppressed.

While a NAND type flash memory has various advantages as explained above, it suffers from the following problems.

Namely, in the data programming operation of a NAND type flash memory, in the case there is a large difference in the programming characteristics due to process variations or the like, there are the problems that the difference of the programming speeds becomes large among memory transistors connected to a selected word line, the number of times of programming/verification is increased, and therefore the speed of programming is restricted.

This is because the difference of the speed of programming due to process variations etc. becomes as long as two orders of programming time difference between memory transistors in the selected word line as shown by experience. Therefore, in the conventional method of repeated application of a simple programming pulse having the same pulse voltage and same pulse duration, it is necessary to also perform the programming/verification up to a hundred times.

In such a case, rather than the substantive time of application of the programming voltage, the time required for switching voltages in the programming operation/verify read operation becomes dominant, so the speed of programming is substantially degraded.

In order to avoid such a problem, it is necessary to perform the data programming by suppressing the number of times of programming/verification to about ten times at the maximum.

However, in order to achieve this with the conventional method of repeated application of a simple programming pulse having the same pulse voltage and same pulse duration, it is necessary to apply a programming pulse having a strengthened pulse voltage. In this case, there will be the undesired effects that the memory transistor having the fastest programming speed will be excessively programmed and the differences in the programming threshold voltage Vth will be increased.

A new method of programming of a NAND type flash memory which solves the above problems and can keep down the number of times of programming/verification without increasing the differences of the programming threshold voltage Vth is disclosed in "A 3.3V 32 Mb NAND Flash Memory with Incremental Step Pulse Programming Scheme" '95, ISSCC, p. 128 on.

The data programming operation disclosed in the above document consists of repeatedly performing a programming operation a number of times via a verify read operation in a NAND type flash memory which applies a high programming word line voltage to a selected word line and a reference bit line voltage to the bit line and performs data programming by the difference of programming voltage between the programming word line voltage and the reference bit line voltage so as to program the data. By setting the programming word line voltage to a variable voltage which is incremented along with an increase of the number of times of programming and by setting the reference bit line voltage to a constant voltage regardless of the number of times of programming, the data is programmed so that the difference in the programming voltage is incremented along with an increase of the number of times of programming. This is the reason why this method is referred to as an "Incremental Step Pulse Programming" method (hereinafter referred to the "ISPP" method).

FIG. 2 is a timing chart of the programming of data in a NAND type flash memory by the above ISPP method. The timing chart of FIG. 2 will be explained step by step below.

First, the period from a time t1 to a time t2 is a step for transferring the page programming data to the data latch circuits 1 to m provided for every bit line in synchronization with a page data transfer clock signal $\phi$CL.

Next, the period from the time t2 to a time t4 is a step for performing the first programming/verify operation.

Namely, under the control of a programming/verification control signal $\phi$P/R, a first programming word line voltage VPP1 (14V) and a verify read word line voltage VR (1.5V) are alternately applied to the selected word line WL, while an intermediate value programming prohibit voltage VM (8V) and read voltage VCC (3.3V) for passing through the NAND string are alternately applied to the nonselected word lines WL. Further, a reference bit line voltage GND (0V) is applied to the selected bit line BL to which the programming memory transistor is connected, while an intermediate value programming prohibit voltage VM (8V) is applied to the nonselected bit lines BL to which the non-programming memory transistors are connected. As a result, the first programming is ended by the time t4, the latch data of the programmed cell is inverted, and the programming prohibit state is established starting the next time.

The period from the time t4 to a time t6 is a step for performing the second programming/verify operation. This is basically the same as the first programming/verify operation. The difference lies in the fact that a second programming word line voltage VPP2 (14.5V) is set incremented by 0.5V from the first programming word line voltage VPP1 (14V).

The period from the time t6 to a time t8 is a step for performing a third programming/verify operation. Similarly, a third programming word line voltage VPP3 (15V) is set incremented by another 0.5V.

Finally, the period from a time t9 to a time t11 is a step for performing a last k-th (for example 10th) programming/verify operation. The programming operation is ended upon detection that a kth programming word line voltage VPPk (18.5V) is supplied. All programs are ended, then the data of all data latch circuits become the high level.

Note that the programming is not always carried out up to the last k-th (for example 10th) time and is automatically ended if it is detected that the data of all data latch circuits become the high level.

In a data programming operation using such an ISPP method, even if a memory transistor is programmed and the threshold voltage Vth rises along with an increase of the number of times of programming, the reduction in the floating gate voltage due to rising Vth is compensated for by the increment of programming word line voltage, thus the electric field applied to the tunnel oxide film of the memory transistor is held constant.

Accordingly, the value of the FN tunnel current injected to the floating gate is always held at a constant value regardless of the increase of the number of times of programming. The increase of the number of times of programming and the rise of the programming threshold voltage Vth are in a linear relationship with each other.

As a result, high precision control of the programming threshold voltage Vth becomes possible while keeping down the number of times of programming/verification.

As opposed to this, in a data programming operation using the conventional method of repeated application of a simple programming pulse having the same pulse voltage and same pulse duration, when a memory transistor is programmed and the threshold voltage Vth rises along with the increase of the number of times of programming, the floating gate voltage is lowered by rising Vth and therefore the electrical field applied to the tunnel oxide film of the memory transistor is reduced.

Accordingly, the value of the FN tunnel current injected into the floating gate is decremented along with the increase of the number of times of programming, a saturation phenomenon of the programming threshold voltage Vth becomes conspicuous along with the increase of the number of times of programming, and theoretically the relationship of the value of the rise of the programming threshold voltage Vth with respect to the increase of the number of times of programming becomes logarithmic.

As a result, control of the programming threshold voltage Vth with a good precision and keeping down the number of times of programming/verification is difficult. If the programming voltage is set higher, the undesired effects of excessive programming etc. are caused.

While a data programming operation using the above ISPP method is very excellent as a programming method in view of the fact that it is possible to achieve both suppression of the number of times of the programming/verification and high precision programming control. But it has the following problems.

First, in a data programming operation using the ISPP method, it is necessary to generate a programming word line voltage having a value which is incremented in steps along with the increase of the number of times of programming.

A concrete example of a circuit for generation of such a programming word line voltage is disclosed in the IEEE Journal of Solid-state Circuits, Vol. 30, No. 11, November 1995, p. 1152, FIG. 7.

However, in the circuit for generation of the programming word line voltage disclosed in the above document, since the programming word line voltage has to be a high voltage of about 20V, it must be prepared by a high voltage source generated by a boosting circuit. The configuration of a boosting circuit and a programming word line voltage generating means in which the voltage changes in steps is not easy.

Second, in a data programming operation using the above ISPP method, only the programming word line voltage is incremented; therefore the voltage balance between the programming word line voltage, the reference bit line voltage, and the programming prohibit voltage changes along with an increase of the number of times of programming. As a result, there is a problem of a degradation of the disturb margin with respect to the nonprogramming memory transistors.

For example, in the example shown in FIG. 2 mentioned above, along with the number of times of programming (k=1 to 10), the programming word line voltage gradually changes from VPP1 to VPPk=14V to 18.5V, but the reference bit line voltage is fixed to 0V and the programming prohibit voltage is fixed to 8V.

Accordingly, the difference of programming voltages supplied to the programming memory transistor located at a position where the selected word line and the selected bit line intersect gradually changes within a range of from 14V to 18.5V along with the number of times of programming.

Contrary to this, the disturb voltage supplied to the nonprogramming memory transistors located at the positions where the selected word line and the nonselected bit lines intersect gradually changes from 6V to 10.5V along with the number of times of programming.

Further, the disturb voltage supplied to the nonprogramming memory transistors located at positions where the nonselected word lines and the selected bit line intersect is a constant 8V regardless of the number of times of programming.

In a data programming operation of a general NAND type flash memory, in order to secure the maximum disturb margin, it is necessary to optimally set the voltage balance among the programming word line voltage, the reference bit line voltage, and the programming prohibit voltage so that the disturb voltage supplied to above two types of nonprogramming memory transistors becomes a half of the difference of programming voltages supplied to the programming memory transistor.

Accordingly, in the example of FIG. 2 mentioned above, ideally both of the disturb voltages supplied to the two types of nonprogramming memory transistors should be gradually changed from 7V to 9.25V along with the number of times of programming.

From the above viewpoint, in a data programming operation using the ISPP method of the conventional example of FIG. 2, the disturb balance is degraded as follows.

Namely, the disturb voltage supplied to the nonprogramming memory transistors located at positions where the selected word line and the nonselected bit lines intersect is reduced by 1V from the ideal value at an initial stage of the number of times of programming, but in the last stage of the number of times of programming, the disturb voltage becomes greater than the ideal value by 1.25V.

On the other hand, the disturb voltage supplied to the nonprogramming memory transistors located at positions where the nonselected word lines and the selected bit line intersect becomes greater than the ideal value by 2V in the initial stage of the number of times of programming, while the disturb voltage is reduced from ideal value by 2.5V of the last stage in the number of times of programming.

Accordingly, since the final intensity of the disturbance is determined by the more intenser disturb mode of the two types of disturb modes, the disturb voltage becomes greater than the ideal value by 2V in the initial stage of the number of times of programming, while the disturb voltage becomes greater than the ideal value by 1.25V in the last stage of the number of times of programming.

Converted to disturbance time, it has been estimated by experience that the resistance to disturbance is degraded by about 1.5 to 3 orders.

SUMMARY OF THE INVENTION

The present invention was made in consideration with such a circumstance. A first object thereof is to realize a semiconductor nonvolatile memory device capable of performing data programming at a high speed and with a high precision by a simple boosting circuit configuration, while maintaining similar effects as those by the ISPP method.

A second object of the present invention is to realize a semiconductor nonvolatile memory device capable of performing data programming at high speed and with a high precision with a similar efficiency to that by the ISPP method, while eliminating the degradation of the disturb margin accompanying the ISPP method.

According to the present invention, there is provided a NAND type semiconductor nonvolatile memory device wherein a plurality of memory transistors are arranged in the form of a matrix, a plurality of NAND strings formed by a series connection of said memory transistors are connected to bit lines, the memory transistors arranged in the same row are connected to a word line, a high programming word line voltage is applied to the word line to which the memory transistors are connected, a reference bit line voltage is applied to the bit line, and the difference of programming voltages between the programming word line voltage and the reference bit line voltage is used to electrically perform the data programming for the memory transistors, the semiconductor nonvolatile memory device comprising a means for repeatedly performing a programming operation a plurality of times via a verify read operation and a means for setting the programming word line voltage to a constant voltage regardless of the number of times of programming, so as to set the reference bit line voltage to a variable voltage which is decremented along with the number of times of programming, and incrementing the programming voltage difference along with an increase of the number of times of programming.

Accordingly, by changing the low reference bit line voltage without changing the high programming word line voltage, it is possible to perform data programming at a high speed and with a high precision while maintaining substantially the same effects as those by the ISPP method.

In addition, a circuit for decrementing a low reference bit line voltage can be configured far more simply than a circuit for incrementing a high programming word line voltage.

According to the present invention, there is further provided a NAND type semiconductor nonvolatile memory device wherein a plurality of memory transistors are arranged in the form of a matrix, a plurality of NAND strings formed by a series connection of said memory transistors are connected to bit lines, the memory transistors arranged in the same row are connected to a common word line, a high programming word line voltage and reference bit line voltage are applied to the word lines and bit lines to which the memory transistors are connected, the difference of programming voltages between the programming word line voltage and the reference bit line voltage is used to electrically perform the data programming for a selected memory transistor, and a programming prohibit voltage set to be lower than the programming word line voltage but higher than the reference bit line voltage is applied to at least one of the word lines and bit lines of the nonselected memory transistors to prohibit the data programming to the nonselected memory transistors, said semiconductor nonvolatile memory device comprising a means for repeatedly performing a programming operation a plurality of number of times via a verify read operation, and a means for setting the reference bit line voltage to a constant voltage regardless of the number of times of programming, and incrementing both of the programming word line voltage and programming prohibit voltage along with an increase of the number of times of programming.

Further, in the NAND type semiconductor nonvolatile memory device, each voltage increment of the programming prohibit voltage for every increase of the number of times of programming is set to a half of each voltage increment of the programming word line voltage for every Increase of the number of times of programming.

Accordingly, also, the two types of disturb voltages applied to the nonprogramming memory transistors are incremented at the same rate as that of the increment of the difference of the programming voltages applied to the programming memory transistor along with an increase of the number of times of programming.

For this reason, the degradation of the disturb margin which becomes a problem in the conventional ISPP method can be eliminated.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

First Embodiment

Figure 1:
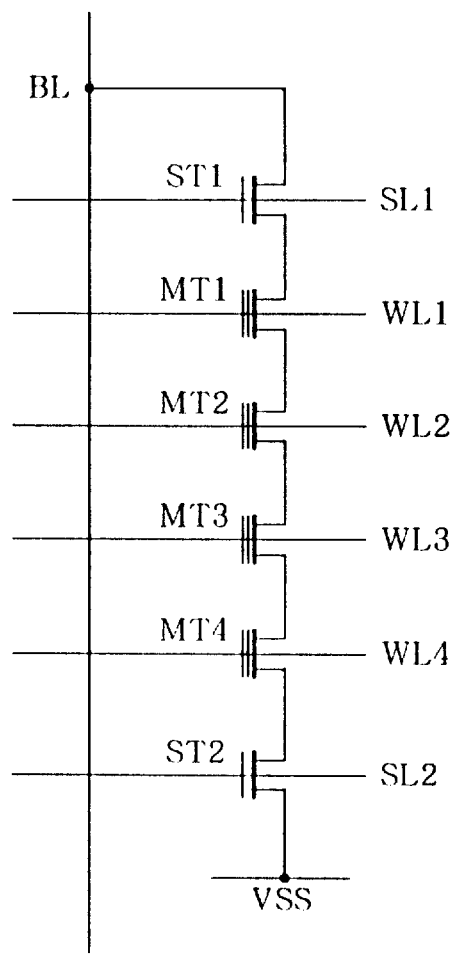
FIG. 1 is a view of a memory array structure in a NAND type flash memory.
Figure 2:
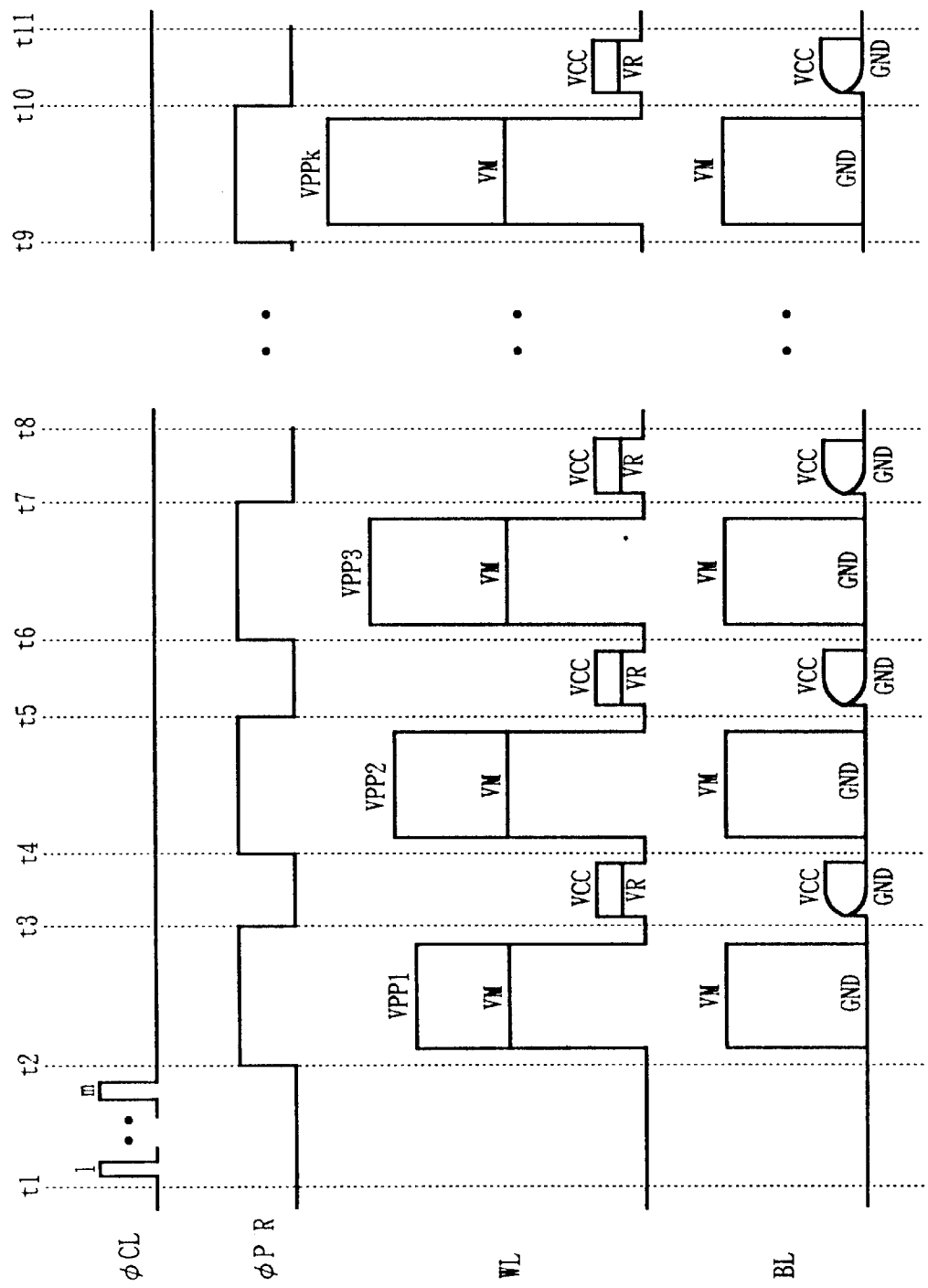
FIG. 2 is a timing chart of the conventional data programming of a NAND type flash memory using the ISPP method.
Figure 3:
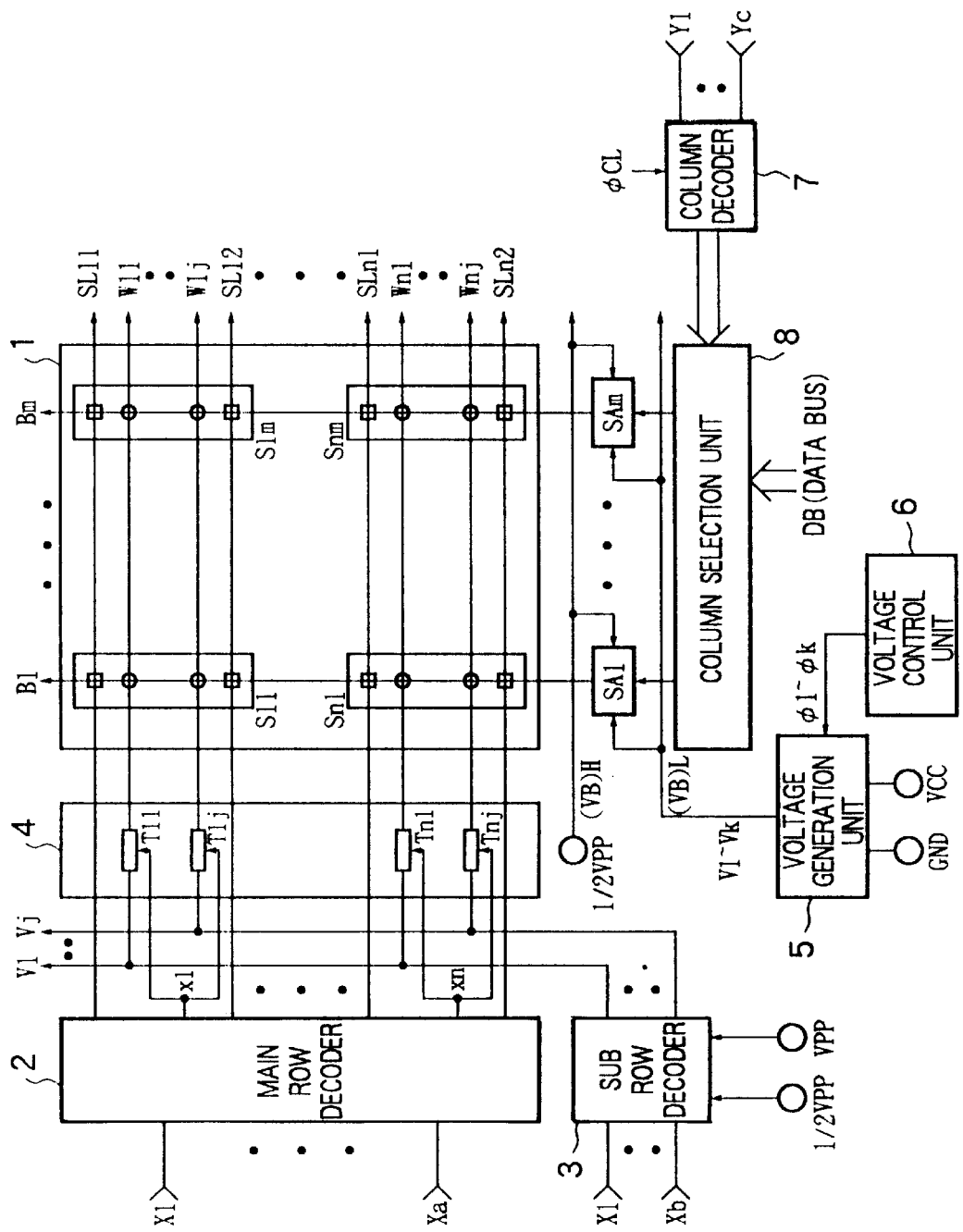
FIG. 3 is a view of an example of the concrete configuration of a NAND type flash memory according to the present invention at the time of a data programming operation.

FIG. 3 is a view of an example of the concrete configuration of a semiconductor nonvolatile memory device according to the present invention, more concretely, the data programming system circuit of a NAND type flash memory.

In FIG. 3, reference numeral 1 denotes a memory array. In the memory array 1, M number of bit lines B1 to Bm are arranged.

Further, the bit lines B1 to Bm are each connected to n number of NAND strings. Each NAND string is constituted by two selection transistors (□ in the figure) and j number of memory transistors (○ in the figure).

That is, the memory array 1 is constituted by the NAND strings S11 to Snm.

SLI1 to SLn1 and SL12 to SLn2 denote selection gate lines controlling the selection transistors, while WL11 to WLnj denote word lines controlling the memory transistors.

Further, SA1 to SAm denote data latch circuits individually provided corresponding to the bit lines B1 to Bm.

A cathode side of the power supply source of the data latch circuits SAl to SAm is connected to a power supply source line (VB)L, while an anode side is connected to a power supply source line (VB)H. At the time of data programming, the power supply source line (VB)L is set to the reference bit line voltages V1 to Vk (for example 3V to 0.3V) which decrement along with an increase of the number of times of programming (k=1 to 10) by 0.3V steps, while the power supply source line (VB)H is set to an intermediate prohibit voltage ½VPP (for example 8V) at constant.

Reference numeral 2 denotes a main row decoder. The main row decoder 2 decodes the higher X1 to Xa of the X inputs and generates output voltages of the selection gate lines SLI1 to SLn1 and SL12 to SLn2 and NAND string selection signals x1 to xn.

Reference numeral 3 denotes a sub row decoder. The sub row decoder 3 decodes the lower X1 to Xb of the X inputs and generates the word line voltages V1 to Vj in the selected NAND string.

Of the word line voltages V1 to VJ at the time of data programming, the selected word line voltage is set to the programming word line voltage VPP boosted up to the high voltage (for example 16V), while the nonselected word line voltage is set to the intermediate prohibit voltage ½ VPP (for example 8V).

Reference numeral 4 denotes a local row decoder. The local row decoder 4 is constituted by transfer circuits T11 to Tnj corresponding to the word lines WL11 to WLnJ and selected by the NAND string selection signals x1 to xn in units of NAND strings.

The transfer circuits T11 to Tnj individually output the word line voltages V1 to Vj to the corresponding word lines when they are selected by the NAND string selection signals and output suitable voltages in accordance with the operation (for example, the ground voltage GND) to the corresponding word lines when they are not selected by the NAND string selection signals.

Reference numeral 7 denotes a reference bit line voltage generation unit. This reference bit line voltage generation unit 7 generates and outputs reference bit line voltages V1 to Vk (for example 3V to 0.3V) which decrement by control signals φ1 to φk along with the number of times of programming (k=1 to 10) by 0.3V steps.

Reference numeral 8 denotes a voltage control unit. The voltage control unit 8 outputs the control signals φ1 to φk along with the number of times of programming (k=1 to 10).

Reference numeral 9 denotes a column decoder. The column decoder 9 decodes the X inputs Y1 to Yc and selects any one of the bit lines B1 to Bm by the column selection unit 10.

The column address at the time of the page programming data transfer is sequentially incremented in synchronization with the page data transfer signal φCL. The page programming data is sequentially serially transferred from the data bus DB to data latch circuits SA1 to SAm.

Figure 4:
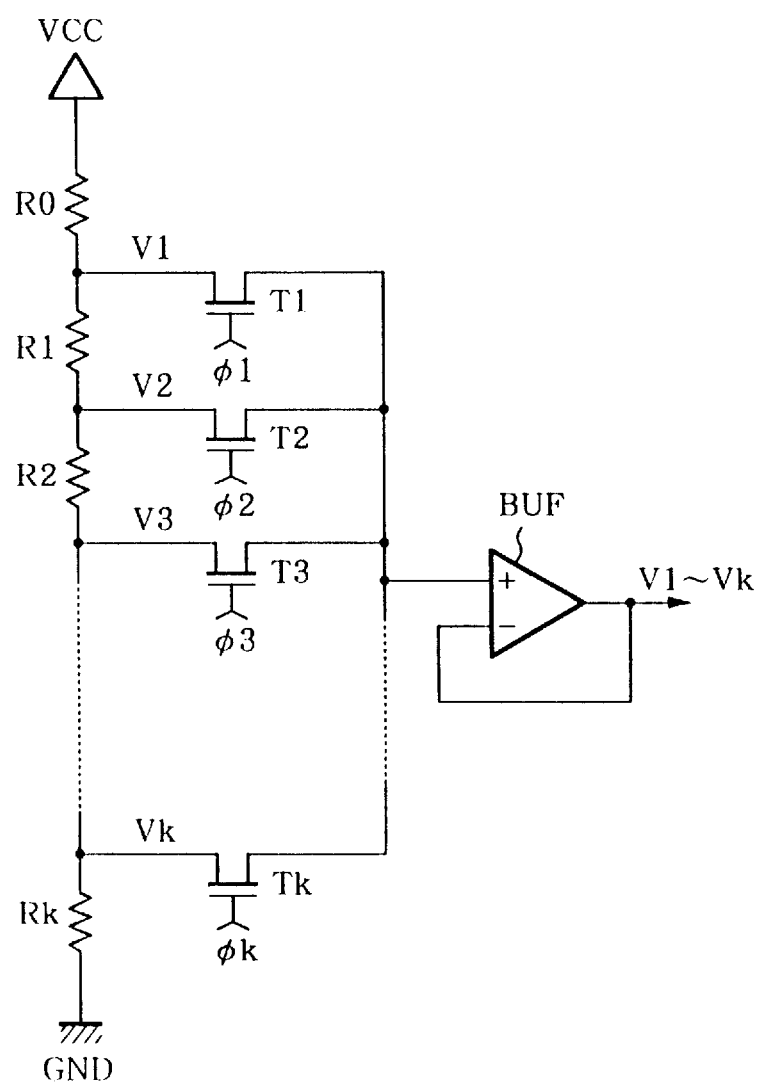
FIG. 4 is a view of an example of the concrete circuit configuration of a reference bit line voltage generation unit in the NAND type flash memory of FIG. 3.

FIG. 4 is a view of an example of the concrete circuit configuration of the reference bit line voltage generation unit 7 in the example of the concrete configuration of the NAND type flash memory of FIG. 3.

In FIG. 4, the interval between the power supply voltages (VCC [3.3V] to GND [0V]) is divided by the series connected resistor elements R0 to Rk (k=10) so that the reference bit line voltages V1 to Vk (for example 3V to 0.3V) changing in 0.3V steps are generated. Further, the reference bit line voltages V1 to Vk are output via a buffer BUF which selects one reference bit line voltage in accordance with the number of times of programming under the control of the control signals $\phi 1$ to $\phi k$ via the transfer gates T1 to Tk and takes for example a voltage follower configuration.

Figure 5:
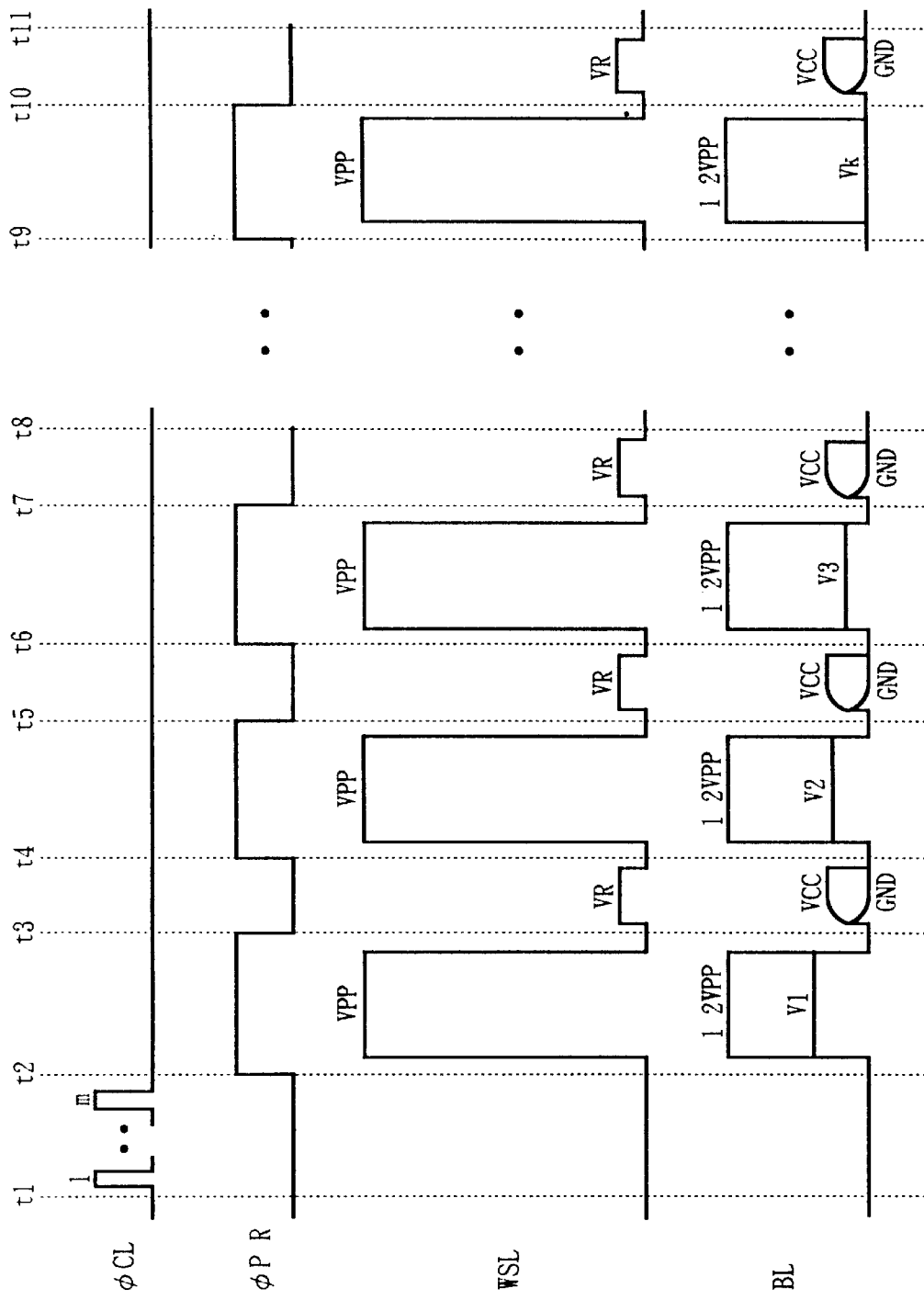
FIG. 5 is a timing chart of the data programming in the NAND type flash memory of FIG. 3.

FIG. 5 is a timing chart of the data programming in an example of the configuration of a NAND type flash memory according to the first embodiment of the present invention of FIG. 3.

Below, the timing chart of the data programming of FIG. 5 will be explained referring to the example of the configuration of FIG. 3 etc.

First, the period from the time t1 to the time t2 is the step for transferring the page programming data to the data latch circuits 1 to M provided for every bit line in synchronization with the page data transfer clock signal $\phi CL$.

Next, the period from the time t2 to the time t4 is the step for performing the first programming/verify operation.

Namely, under the control of the programming/verification control signal $\phi P/R$, the programming word line voltage VPP (16V) and the verify read word line voltage VR (1.5V) are alternately applied to the selected word line WSL. Further, the selected bit line to which the programming memory transistor is connected is applied with a first reference bit line voltage V1 (3V), while the nonselected bit lines to which the nonprogramming memory transistors are connected are applied with an intermediate prohibit voltage ½ VPP (8V). As a result, the first programming is ended before the time t4, the latch data of the programmed cell is inverted, and the programming prohibit state is established the next time.

The period from the time t4 to the time t6 is the step for performing the second programming/verify operation. This is basically similar to the first programming/verify operation. The difference resides in the fact that the second programming word line voltage V2 (2.7V) is decremented by 0.3V from the first reference bit line voltage V1 (3V).

The period from the time t6 to the time t8 is the step for performing the third programming/verify operation. Similarly a third reference bit line voltage V3 (2.4V) is decremented by 0.3V.

Finally, the period from the time t9 to the time t11 is the step for performing the last k-th (for example 10th) programming/verify operation. By detecting that the k-th reference bit line voltage Vk (0.3V) is applied, all programs are ended, the data of all data latch circuits become the high level, and the programming operation is ended.

Note that the programming is not always carried out up to the last k-th time (for example 10th time), but is automatically ended when it is detected that the data of all data latch circuits become the high level.

As explained above, according to the NAND type flash memory of the first embodiment of the present invention, the data programming is carried out by the difference of programming voltages between the programming word line voltage and the reference bit line voltage, the programming word line voltage is set to a constant voltage regardless of the number of times of programming, and the reference bit line voltage is decremented along with an increase of the number of times of programming, so the programming voltage difference is incremented along with an increase of the number of times of programming.

Accordingly, by changing the low reference bit line voltage without changing the high programming word line voltage, substantially the same effects as those by the ISPP method are obtained and it is possible to perform data programming at a high speed and with a high precision.

In addition, a circuit for decrementing a low reference bit line voltage can be configured considerably more simply than a circuit for incrementing a high programming word line voltage.

Further, in the above explanation, for convenience, a NAND type flash memory was mainly explained, but apparently the present invention can be applied to other semiconductor nonvolatile memory devices performing data programming by injecting electrons into a floating gate by the FN tunnel phenomenon.

Second Embodiment

Figure 6:
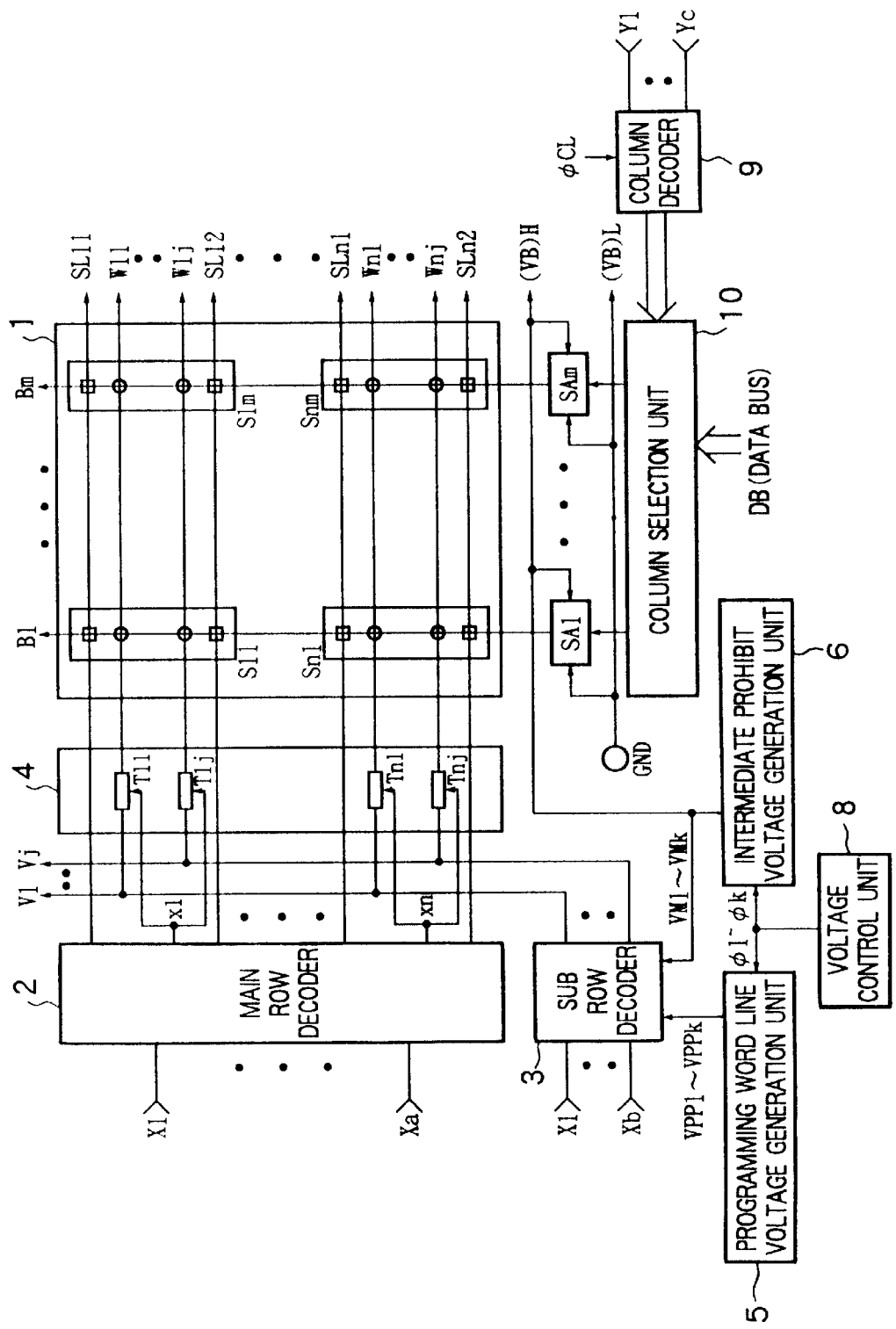
FIG. 6 is a view of an example of the concrete configuration of a NAND type flash memory according to a second embodiment of the present invention.

FIG. 6 is a view of an example of the concrete configuration of a data programming system circuit of a NAND type flash memory according to a second embodiment of the present invention.

In FIG. 6, reference numeral 1 denotes a memory array. In the memory array 1, m number of bit lines B1 to Bm are arranged.

Further, the bit lines B1 to Bm are each connected to n number of NAND strings. Each NAND string is constituted by two selection transistors (□ in the figure) and j number of memory transistors (○ in the figure).

That is, the memory array 1 is constituted by the NAND strings S11 to Snm.

SL11 to SLn1 and SL12 to SLn2 denote selection gate lines controlling the selection transistors, while WL11 to WLnj denote word lines controlling the memory transistors.

Further, SA1 to SAm denote data latch circuits provided corresponding to each of the bit lines B1 to Bm.

The cathode side of the power supply source of the data latch circuits SA1 to SAm is connected to the power supply source line (VB)L, while the anode side is connected to the power supply source line (VB)H. At the time of data programming, the power supply source line (VB)L is set to the reference bit line voltage GND (0V), while the power supply source line (VB)H is set to any of the intermediate value programming prohibit voltages VM1 to VMk=7V to 9.25V incrementing by 0.25V steps according to the number k (k=1 to 10) of programming.

Reference numeral 2 denotes a main row decoder. The main row decoder 2 decodes upper X1 to Xa of X inputs and generates output voltages of the selection gate lines SL11 to SLn1 and SL12 to SLn2 and NAND string selection signals x1 to xn.

Reference numeral 3 denotes a sub row decoder. The sub row decoder 3 decodes the lower X1 to Xb of the X inputs and generates the word line voltages V1 to Vj in the selected NAND string.

Of the word line voltages V1 to Vj at the time of data programming, the selected word line voltage is set to any of the programming word line voltages VPP1 to VPPk=14V to 18.5V boosted up to the high voltage and incremented 0.5V steps along with the number k (k=1 to 10) of programming, while the nonselected word line voltage is set to either of the intermediate programming prohibit voltages VM1 to VMk= 7V to 9.25V incremented in 0.25V steps according to the number k (k=1 to 10) of programming.

Reference numeral 4 denotes a local row decoder. The local row decoder 4 is constituted by transfer circuits T11 to Tnj corresponding to the word lines WL11 to WLnj and selected by the NAND string selection signals x1 to xn in units of NAND strings.

The transfer circuits T11 to Tnj individually output the word line voltages V1 to Vj to the corresponding word lines when they are selected by the NAND string selection signals and output suitable voltages in accordance with the operation (for example, the ground voltage GND) to the corresponding word lines when they are not selected by the NAND string selection signals.

Reference numeral 5 denotes a programming word line voltage generation unit. The programming word line voltage generation unit 5 generates the programming word line voltages VPP1 to VPPk boosted up to a high voltage and incremented by the control signals $\phi 1$ to $\phi k$ along with the number k (k=1 to 10) of programming.

Reference numeral 6 denotes an intermediate prohibit voltage generation unit. The intermediate prohibit voltage generation unit 6 generates and outputs intermediate programming prohibit voltages VM1 to VMk incremented by the control signals $\phi 1$ to $\phi k$ along with the number k (k=1 to 10) of programming.

Reference numeral 8 denotes a voltage control unit. The voltage control unit 8 outputs the control signals $\phi 1$ to $\phi k$ along with the number k (k=1 to 10) of programming.

Reference numeral 9 denotes a column decoder. The column decoder 9 decodes the Y inputs Y1 to Yc and selects any one of the bit lines B1 to Bm by the column selection unit 10.

The column address at the time of page programming data transfer is sequentially incremented in synchronization with the page data transfer signal $\phi CL$. The page programming data is sequentially serially transferred from the data bus DB to data latch circuits SA1 to SAm.

In the NAND type flash memory of the second embodiment of the present invention of FIG. 6, the programming word line voltage is set so as to be incremented in 0.5V steps from 14V to 18.5V along with the number k (k=1 to 10) of programming, while the programming prohibit voltage is set so as to be incremented in 0.25V steps from 7V to 9.25V along with the number k (k=1 to 10) of programming.

On the other hand, the reference bit line voltage is set to a constant 0V regardless of the number k (k 1 to 10) of programming.

Accordingly, both of the two types of disturb voltages applied to the nonprogramming memory transistors are incremented in 0.25V steps from 7V to 9.25V along with the number k (k=1 to 10) of programming and become Just a half of the difference of programming voltages applied to the programming memory transistors regardless of the number of times of programming.

For this reason, the degradation of the disturb margin which was a problem in the conventional ISPP method can be prevented.

Figure 7:
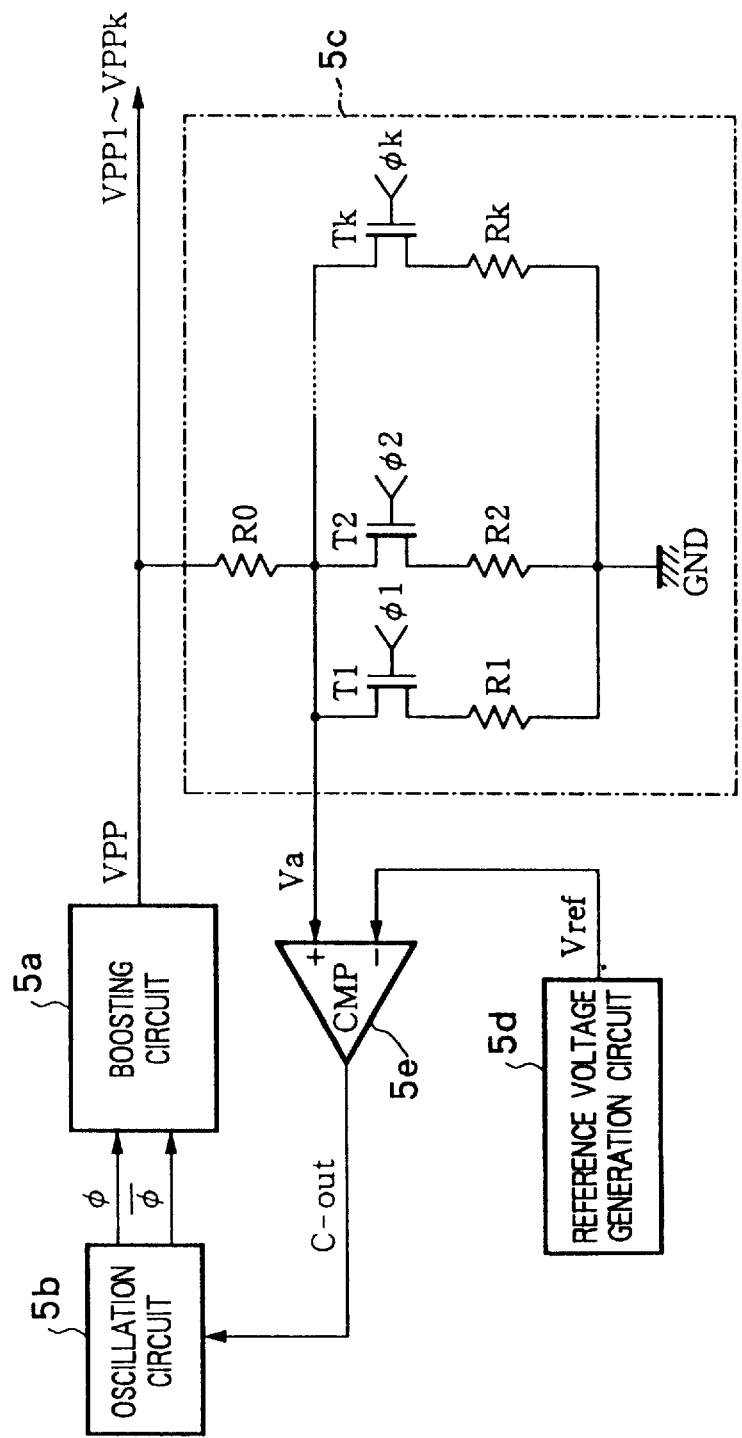
FIG. 7 is a view of an example of the concrete circuit configuration of the programming word line voltage generation unit in the NAND type flash memory of FIG. 6.

FIG. 7 is a view of an example of the concrete circuit configuration of the programming word line voltage generation unit 5 in the example of the concrete configuration of the NAND type flash memory of the second embodiment of FIG. 6. Basically, the circuit configuration of the intermediate prohibit voltage generation unit 6 is also similar.

In FIG. 7, 5a denotes a boosting circuit. The boosting circuit 5a is driven by a complementary clock signal output from an oscillation circuit 5b and outputs a boosted voltage VPP.

Reference numeral 5c denotes a resistance divider. The resistance divider 5c outputs a divided voltage Va by serially connecting the resistor element R0 to one of the resistor elements R1 to Rk via the transfer gates T1 to Tk controlled by the control signals $\phi 1$ to $\phi k$.

Reference numeral 5d denotes a reference voltage generation circuit. The reference voltage generation circuit 5d generates a reference voltage Vref.

Reference numeral 5e denotes a comparator. The comparator 5e outputs a comparison output C-out between the divided voltage Va of the resistor divider 5a and the reference voltage Vref, stops the oscillation circuit 5b when the divided voltage Va becomes larger than the reference voltage Vref, and reactivates it when the former becomes smaller than the latter.

The output programming word line voltage VPP1 to VPPk generated above circuit theoretically become following voltages.

$$(VPP)1 \text{ to } k = Vref \times \{1 + (R_0/R_{1-k})\} \tag{1}$$

Accordingly, by setting the resistance values $R_0$ to $R_k$ of the resistor elements R1 to Rk so as to be decremented according to the increase of k (k=1 to 10), the programming word line voltages VPP1 to VPPk can be incremented.

Figure 8:
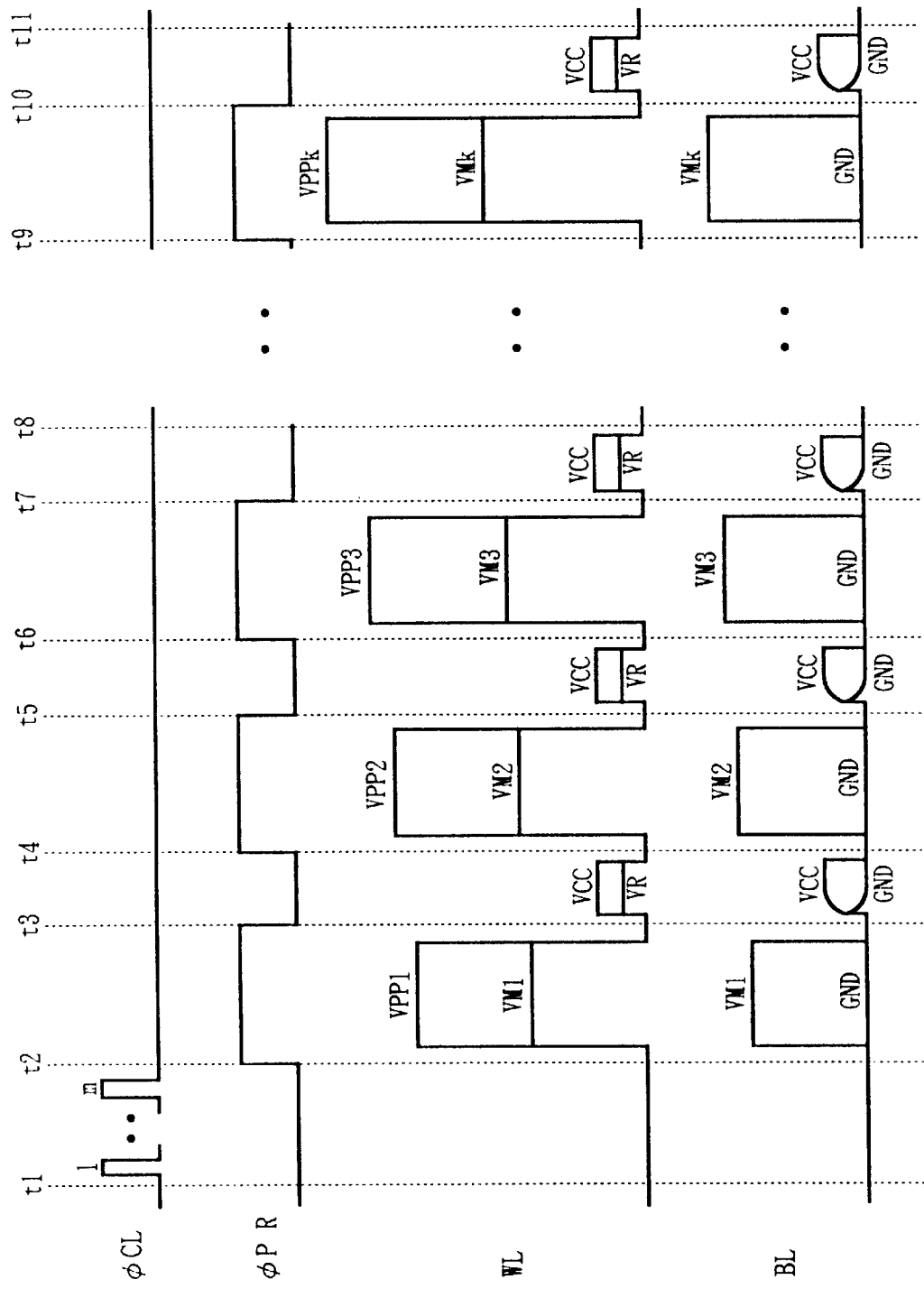
FIG. 8 is a timing chart of the data programming in the NAND type flash memory of FIG. 6.

FIG. 8 is a timing chart of a data programming operation in the example of the configuration of the NAND type flash memory according to the second embodiment of the present invention of FIG. 6.

Below, the timing chart of FIG. 8 will be explained referring to the example of the configuration of FIG. 6 etc.

First, the period from the time t1 to the time t2 is the step for transferring the page programming data to the data latch circuits 1 to m provided for every bit line in synchronization with the page data transfer clock signal $\phi CL$.

Next, the period from the time t2 to the time t4 is the step where k=1, that is, the first programming/verify operation is carried out.

Namely, under the control of the programming/verification control signal $\phi P/R$, the first programming word line voltage VPP1 (14V) and the verify read word line voltage VR (1.5V) are alternately applied to the selected word line WL. The intermediate first programming prohibit voltage VM1 (7V) and read voltage VCC (3.3V) for passing the NAND string are alternately applied to the nonselected word lines WL. Further, the reference bit line voltage GND (0V) is applied to the selected bit line BL to which the programming memory transistor is connected, while the intermediate programming prohibit voltage VM1 (7V) is applied to the nonselected bit lines BL to which the nonprogramming memory transistors are connected.

As a result, the first programming is ended before the time t4, the latch data of the programmed cell is inverted, and the programming prohibit state is established the next time.

The period from the time t4 to the time t6 is the step where k=2, that is, the second programming/verify operation is carried out. Basically, this step is the same as the first programming/verify operation. The difference resides in the fact that the second programming word line voltage VPP2 (14.5V) is incremented by 0.5V from the first programming word line voltage VPP1 (14V), while the second programming prohibit voltage VM2 (7.25V) is incremented by 0.25V from the first programming prohibit voltage VM1 (7V).

The period from the time t6 to the time t8 is the step where k=3, that is, the third programming/verify operation is carried out. Similarly, the third programming word line voltage VPP3 (15V) is incremented by 0.5V, while the third programming prohibit voltage VM3 (7.5V) is incremented by 0.25V.

Finally, the period from the time t9 to the time t11 is the step for performing the last k-th (10th) programming/verify operation. In this step, when detecting that the k-th programming word line voltage VPPk (18.5V) is applied, the k-th programming prohibit voltage VMk (9.25V) is applied, all programs are ended, then the data of all data latch circuits become the high level and the programming operation is ended.

Note that the programming is not always carried out up to the last k-th (10th) time, but is automatically ended when detecting that the data of all data latch circuits become the high level.

As explained above, according to the NAND type flash memory of the second embodiment of the present invention, the data programming is carried out with respect to the programming memory transistors by the difference of programming voltages between the programming word line voltage and the reference bit line voltage, the reference bit line voltage is set to a constant voltage regardless of the number of times of programming, and then the programming word line voltage is incremented along with an increase of the number of times of programming.

Accordingly, substantially similar effects to those by the ISPP method are obtained and it is possible to perform the data programming at a high speed and with a high precision.

Further, the intermediate programming prohibit voltage is incremented along with an increase of the number of times of programming. Each voltage increment of the programming prohibit voltage for every increase of the number of times of programming is set to half of each voltage increment of the programming word line voltage for every increase of the number of times of programming. Accordingly, the two types of disturb voltages applied to the nonprogramming memory transistors are incremented by the same rate as the increment of the difference of the programming voltages applied to the programming memory transistors along with an increase of the number of times of programming.

For this reason, the degradation of the disturb margin which was a problem in the conventional ISPP method can be eliminated.

Third Embodiment

Figure 9:
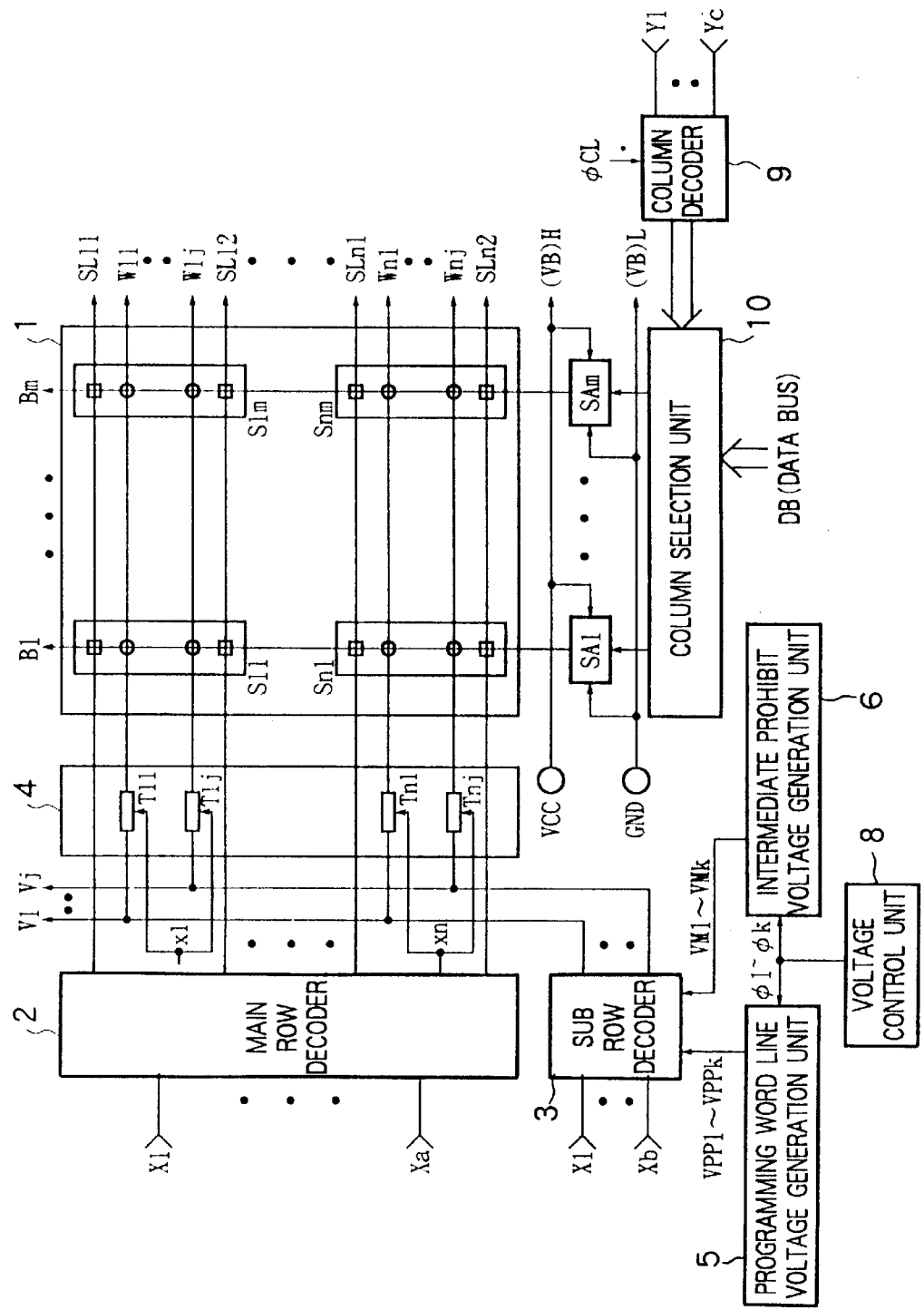
FIG. 9 is a view of an example of the concrete configuration of a NAND type flash memory according to a third embodiment of the present invention.

FIG. 9 is a view of an example of the concrete configuration of the data programming system circuit of the NAND type flash memory according to a third embodiment of the present invention.

The NAND type flash memory of the third embodiment of FIG. 9 is basically similar to the NAND type flash memory of the second embodiment of FIG. 6, but it is an example of a configuration adapted to a data programming operation for performing a so-called self-boost operation disclosed in detail the IEEE Journal of Solid-state Circuits, Vol. 30, No. 11, November 1995, p. 1149.

The difference of the NAND type flash memory of the third embodiment of FIG. 9 from the NAND type flash memory of the second embodiment of FIG. 6 resides in the fact that the power supply source line (VB)H of the data latch circuits SA1 to SAm Is connected to not the programming prohibit voltages VM1 to VMk incrementing along with the number k of programming, but the power supply voltage VCC (3.3V) line.

Accordingly, the load of the programming prohibit voltages VM1 to VMk generated by the boosting circuit is reduced, which is advantageous for a low voltage operation. Also, no high voltage transistors are required, therefore the restrictions in the pattern layout of the data latch circuits SA1 to SAm are reduced, which is advantageous for the reduction of the chip area.

The principle of the self-boost operation disclosed in the above document is not explained here, but in the case of FIG. 9, the substantial voltage applied to the bit line at the time of a data programming operation becomes as follows.

Namely, the reference bit line voltage GND (0V) is applied to the selected bit line BL to which the programming memory transistor is connected, while the voltage Vch substantially represented by the following equation is applied to the nonselected bit lines BL to which the nonprogramming memory transistors are connected by the self-boost principle.

$$Vch \approx Br \cdot VM1 \text{ to } k \qquad (2)$$

Here, Br represents the self-boost efficiency determined by the device structure. Generally, Br can be set to about 0.8.

Accordingly, the substantive voltage Vch applied to the nonselected bit lines is incremented in the same way as the programming prohibit voltages VM1 to VMk which are incremented along with the number k of programming.

Accordingly, in the NAND type flash memory of the third embodiment of the present invention of FIG. 9 as well, similar to the NAND type flash memory of the second embodiment of the present invention of FIG. 6, the two types of disturb voltages supplied to the nonprogramming memory transistors are incremented in steps along with the number k of programming and can be set to about a half of the difference of the programming voltages supplied to the programming memory transistors regardless of the increase in the number of times of programming.

Accordingly, the degradation of the disturb margin which was a problem in the conventional ISPP method can be prevented.

Figure 10:
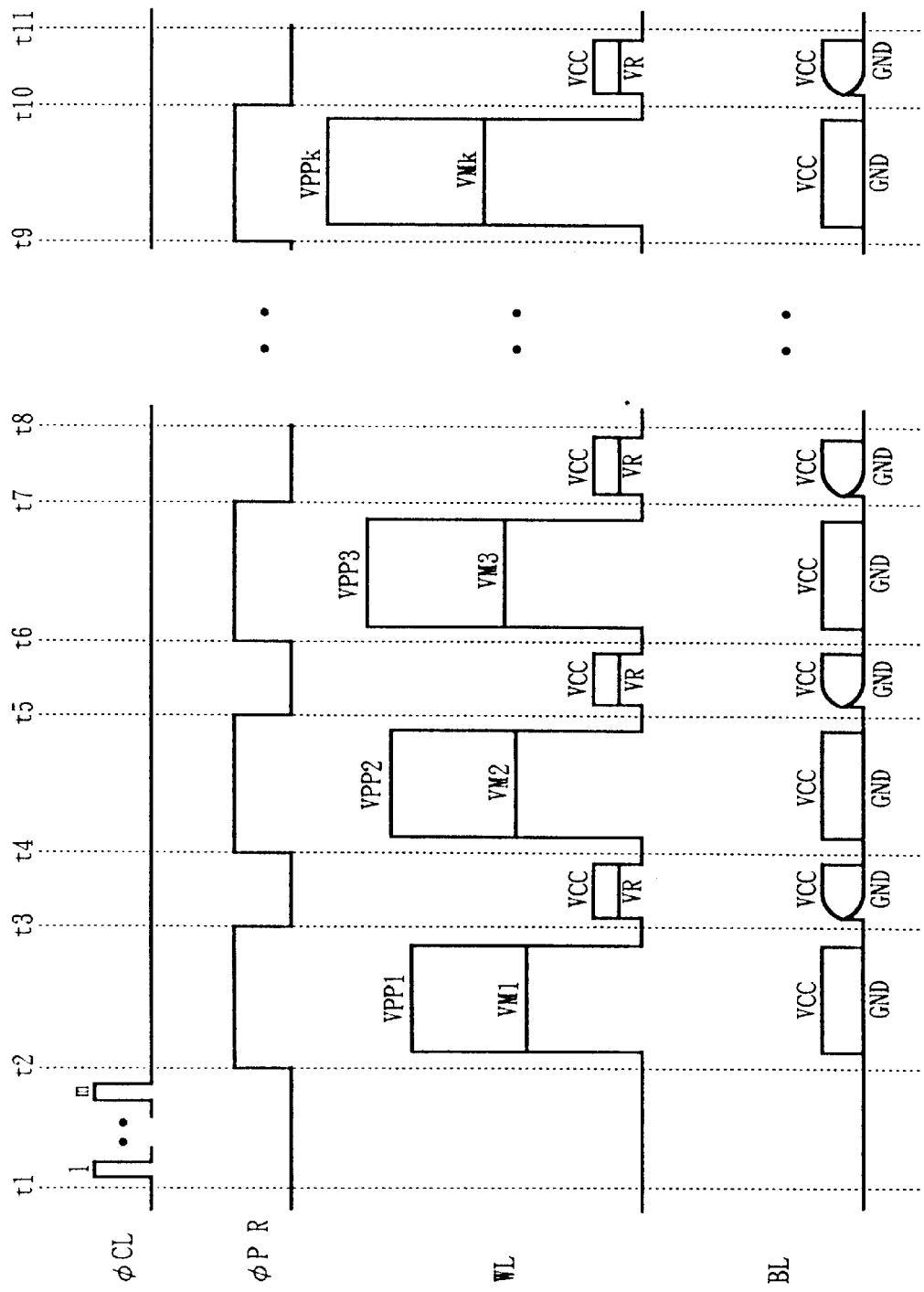
FIG. 10 is a timing chart of the data programming in the NAND type flash memory of FIG. 9.

FIG. 10 is a timing chart of a data programming operation in the example of the configuration of the NAND type flash memory according to the third embodiment of the present invention of FIG. 9.

The timing chart of FIG. 10 is basically the same as the timing chart of the NAND type flash memory of the second embodiment of FIG. 8.

The only difference is that the voltage supplied to the nonselected bit lines BL to which the nonprogramming memory transistors are connected at the time of a data programming operation is not any of the programming prohibit voltages VM1 to VMk incremented along with the number k of programming, but the power supply voltage VCC (3.3V).

As explained above, according to the NAND type flash memory of the third embodiment of the present invention, substantially the same effects as those by the ISPP method can be obtained similar to the NAND type flash memory of the second embodiment of the present invention, it is possible to perform the data programming at a high speed and with a high precision, and the degradation of the disturb margin which was a problem in the conventional ISPP method can be eliminated.

Fourth Embodiment

Figure 11:
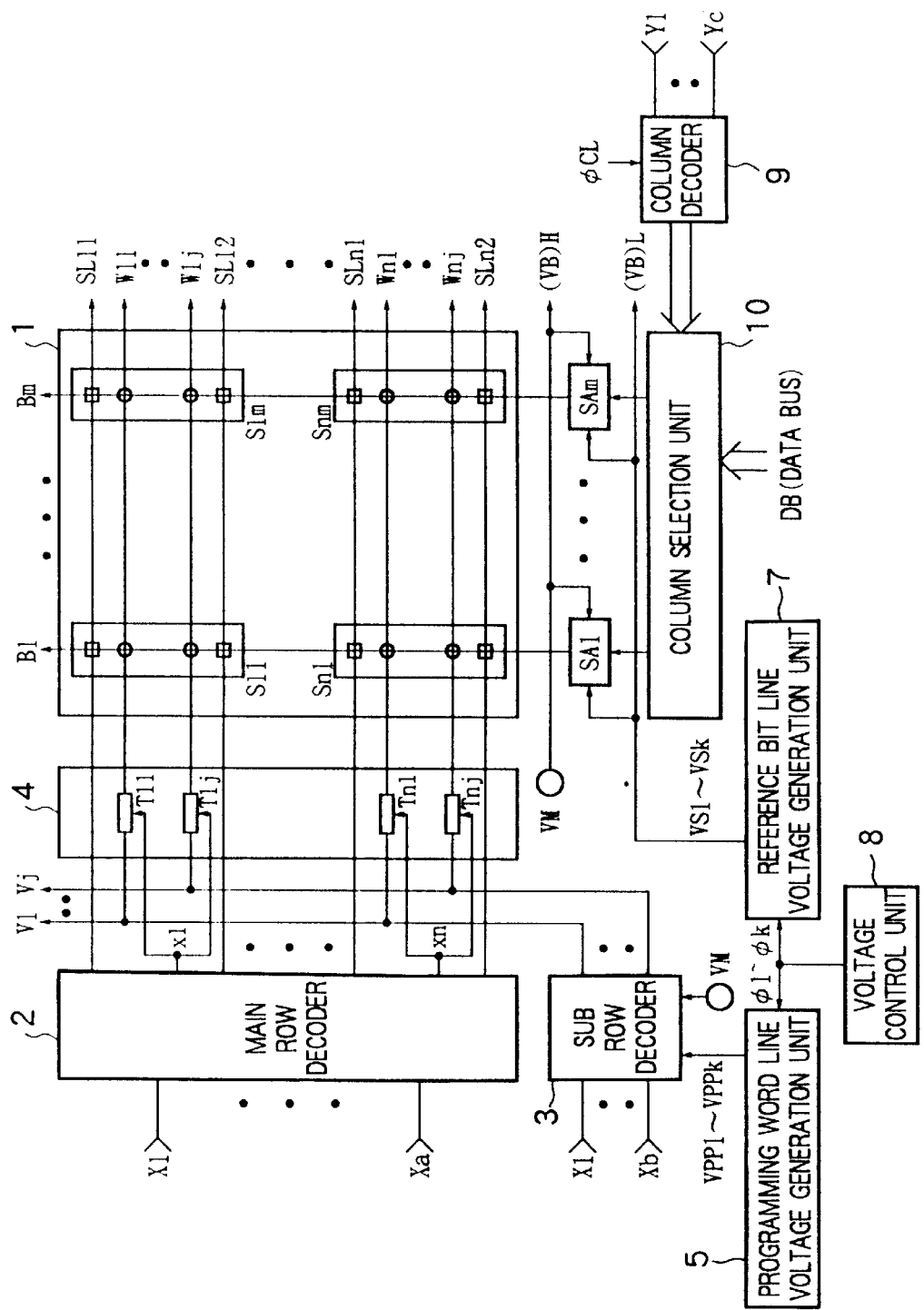
FIG. 11 is a view of an example of the concrete configuration of the NAND type flash memory according to a fourth embodiment of the present invention.

FIG. 11 is a view of an example of the concrete configuration of the data programming system circuit of the NAND type flash memory according to a fourth embodiment of the present invention.

The difference of the NAND type flash memory of the fourth embodiment of FIG. 11 from the NAND type flash memory of the second embodiment of FIG. 6 resides in that, at the time of a data programming operation, the intermediate programming prohibit voltages VM1 to VMk are not incremented along with the number k of the programming, but the reference bit line voltages VS1 to VSk are decremented along with the number k of programming.

Accordingly, it is not necessary to change the programming prohibit voltage generated by the boosting circuit in steps. It is sufficient so far as the reference bit line voltage generated by dividing the power supply voltage VCC (3.3V) is changed in steps. Therefore, the circuit configuration becomes simpler and more preferable.

Below, an explanation will be made focusing on the differences of the NAND type flash memory of the fourth embodiment of FIG. 11 from the NAND type flash memory of the second embodiment of FIG. 6.

In FIG. 11, the cathode side of the power supply source of the data latch circuits SA1 to SAm is connected to the power supply source line (VB)L, while the anode side is connected to the power supply source line (VB)H. At the time of data programming, the power supply source line (VB)L is set to one of the reference bit line voltages VS1 to VSk=2.25V to 0V decremented in 0.25V steps, while the power supply source line (VB)H is set to the intermediate programming prohibit voltage VM=9.25V which is constant regardless of the increase of the number k of programming.

Further, of the word line voltages V1 to Vj at the time of data programming output from the sub decoder 3, the selected word line voltage is set to one of the programming word line voltages VPP1 to VPPk=16.25V to 18.5V boosted to the high voltage and incremented in 0.25V steps along with the number k (k=1 to 10) of programming, while the nonselected word line voltage is set to the intermediate programming prohibit voltage VM=9.25V which is constant regardless of the number k of programming.

The programming word line voltage generation unit 5 generates the programming word line voltages VPP1 to VPPk boosted to the high voltage and incremented by the control signals φ1 to φk along with the number k (k=1 to 10) of programming.

The reference bit line voltage generation unit 7 generates the reference bit line voltages VS1 to VSk decremented by the control signals φ1 to φk along with the number k (k=1 to 10) of programming.

Further, the voltage control unit 8 outputs the control signals φ1 to φk along with the number k (k=1 to 10) of programming.

In the NAND type flash memory of the fourth embodiment of the present invention of FIG. 11, the programming word line voltage is set 80 as to be incremented in 0.25V steps from 16.25V to 18.5V along with the number k (k=1 to 10) of programming, while the reference bit line voltage is set so as to be decremented in 0.25V steps from 2.25V to 0V along with the number k (k=1 to 10) of programming.

On the other hand, the intermediate programming prohibit voltage is set to a constant 9.25V regardless of the increase of the number k (k=1 to 10) of programming.

Accordingly, both of the two types of disturb voltages supplied to the nonprogramming memory transistors are incremented in 0.25V steps from 7V to 9.25V along with the number k (k=1 to 10) of programming and become just a half of the difference of programming voltages supplied to the programming memory transistor regardless of the increase of the number of programming.

For this reason, the degradation of the disturb margin which was a problem in the conventional ISPP method can be prevented.

Figure 12:
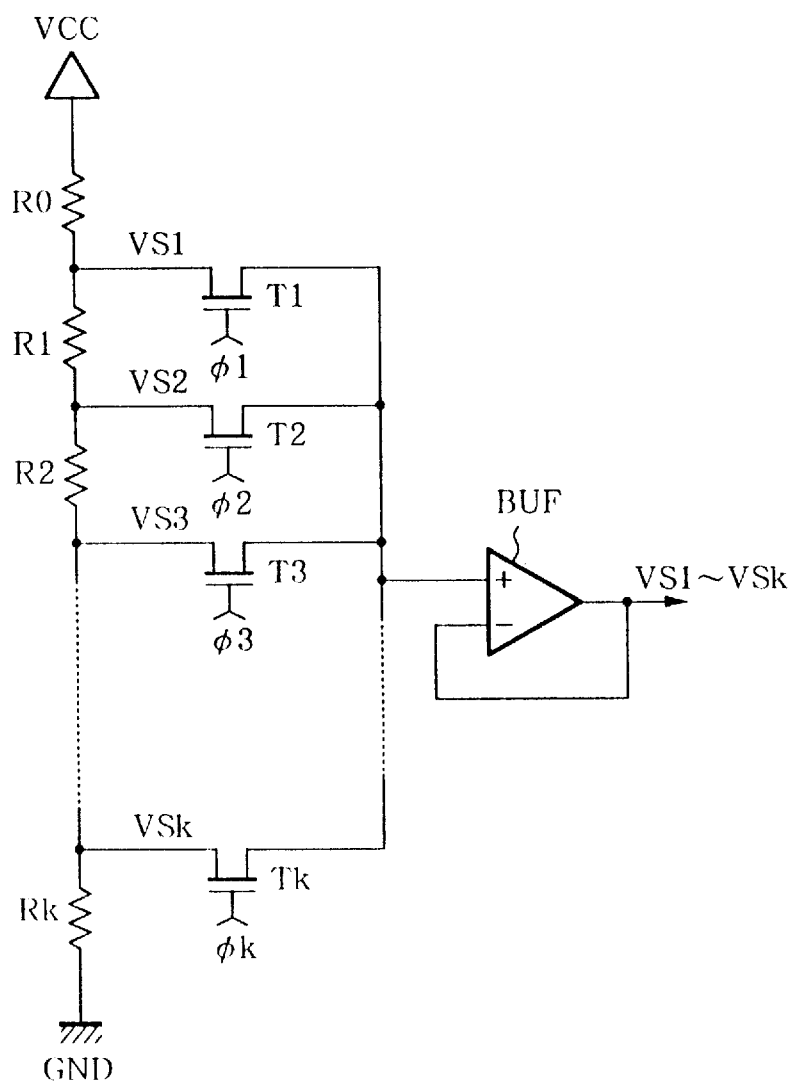
FIG. 12 is a view of an example of the concrete circuit configuration of a reference bit line voltage generation unit in the NAND type flash memory of FIG. 11.

FIG. 12 is a view of an example of the concrete circuit configuration of the reference bit line voltage generation unit 7 in the example of the concrete configuration of the NAND type flash memory of the fourth embodiment of FIG. 11.

In FIG. 12, the interval between the power supply voltages (VCC [3.3V] to GND [0V]) is divided by the series connected resistor elements R0 to Rk to generate the reference bit line voltages VS1 to VSk.

Further, the bit line voltages VS1 to VSk decremented along with the number k (k=1 to 10) of programming are output via the buffer BUF of a voltage follower structure under the control of the control signals φ1 to φk via the transfer gates T1 to Tk.

Figure 13:
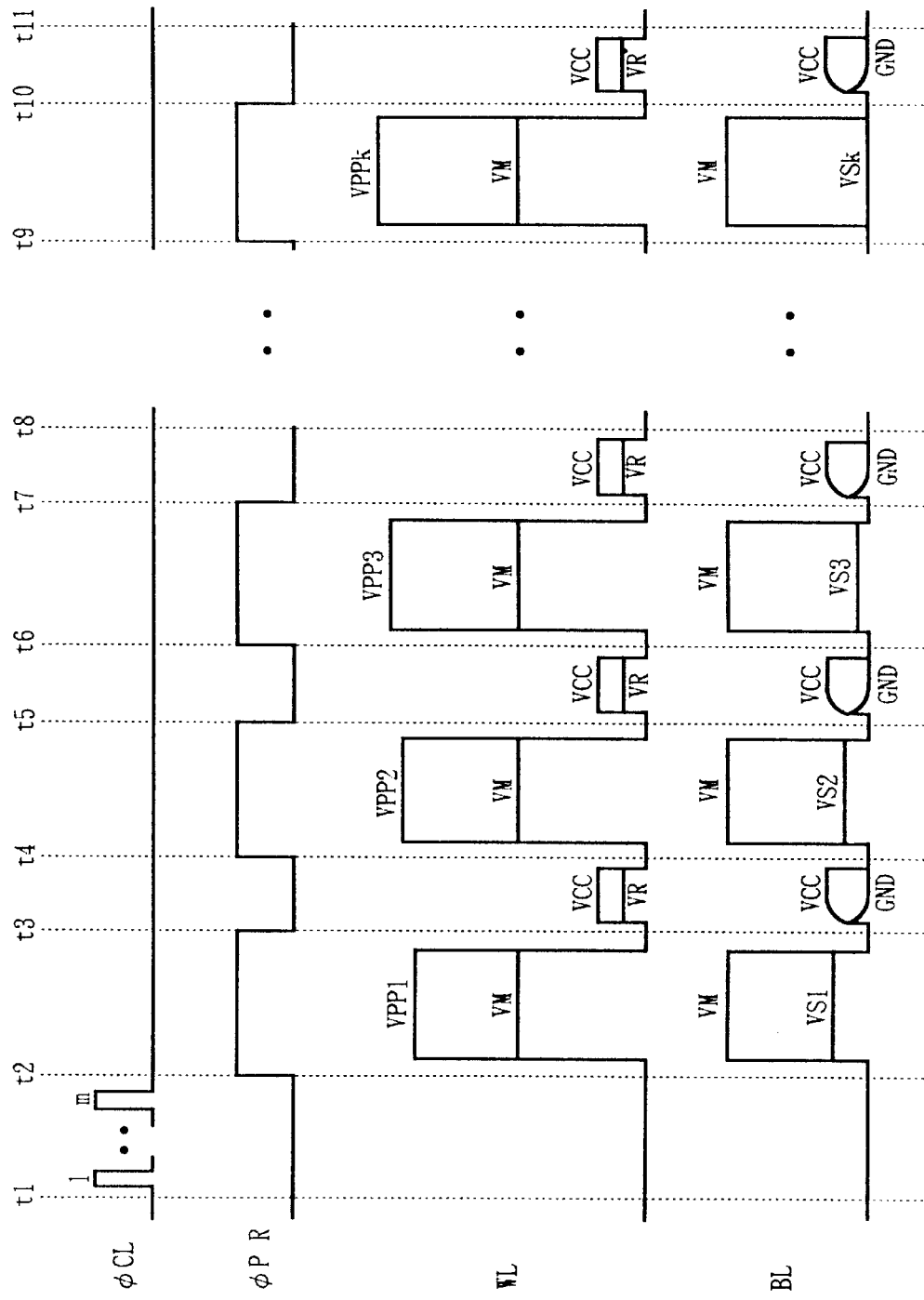
FIG. 13 is a timing chart of the data programming in the NAND type flash memory of FIG. 11.

FIG. 13 is a timing chart of a data programming operation in the example of the configuration of the NAND type flash memory according to the fourth embodiment of the present invention of FIG. 11.

Below, the timing chart of FIG. 13 will be explained referring to the example of the configuration of FIG. 12 etc.

First, the period from the time t1 to the time t2 is the step for transferring the page programming data to the data latch circuits 1 to m provided for every bit line in synchronization with the page data transfer clock signal φCL.

Next, the period from the time t2 to the time t4 is the step where k=1, that is, the first programming/verify operation is carried out.

Namely, under the control of the programming/verification control signal φP/R, the first programming word line voltage VPP1 (16.25V) and the verify read word line voltage VR (1.5V) are alternately applied to the selected word line WL. The intermediate programming prohibit voltage VM (9.25V) and read voltage VCC (3.3V) for passing the NAND column are alternately applied to the nonselected word lines WL. Further, the reference bit line voltage VS1 (2.25V) is applied to the selected bit line BL to which the programming memory transistor is connected at first, while the intermediate programming prohibit voltage VM (9.25V) is applied to the nonselected bit lines BL to which the nonprogramming memory transistors are connected.

As a result, the first programming is ended before the time t4, the latch data of the programmed cell is inverted, and the programming prohibit state is established the next time.

The period from the time t4 to the time t6 is the step where k=2, that is, the second programming/verify operation is carried out. Basically, this step is the same as the first programming/verify operation.

The difference is that the second programming word line voltage VPP2 (16.5V) is incremented by 0.25V from the first programming word line voltage VPP1 (16.25V), and the second reference bit line voltage VS2 (2V) is decremented by 0.25V from the first reference bit line voltage VS1 (2.25V).

The period from the time t6 to the time t8 is the step where k=3, that is, the third programming/verify operation is carried out. Similarly, the third programming word line voltage VPP3 (16.75V) is incremented by 0.25V, while the third reference bit line voltage VS3 (1.75V) is decremented by 0.25V.

Finally, the period from the time t9 to the time t11 is the step for performing the last k-th (10th) programming/verify operation. In this step, when detecting that the k-th programming word line voltage VPPk (18.5V) and the k-th reference bit line voltage VSk (0V) are applied, all programming is ended, the data of all data latch circuits become the high level, and the programming operation is ended.

Note that, the programming is not always carried out up to the last k-th (10th) time, but is automatically ended when detecting that the data of all data latch circuits become the high level.

As explained above, according to the NAND type flash memory of the fourth embodiment of the present invention, the data programming is carried out with respect to the programming memory transistor by the programming voltage difference between the programming word line voltage and the reference bit line voltage, the programming word line voltage is incremented along with an increase of the number of times of programming, and the reference bit line voltage is decremented along with an increase of the number of times of programming.

Accordingly, substantially similar effects to those by the ISPP method can be obtained and it is possible to perform the data programming at a high speed and with a high precision.

In addition, the intermediate programming prohibit voltage is set to a constant voltage regardless of the number of times of programming. Each voltage increment of the programming word line voltage for every increase of number of times of programming and each voltage decrement of the reference bit line voltage for every increase of number of times of programming are set to the same voltage value.

Accordingly, the two types of disturb voltages applied to the nonprogramming memory transistor are also incremented by the same rate as the increment of the difference of programming voltages applied to the programming memory transistor along with an increase of the number of times of programming.

For this reason, the degradation of the disturb margin which was a problem in the conventional ISPP method can be eliminated.

As explained above, according to the NAND type flash memories of the second to fourth embodiments of the present invention, the difference of programming voltages applied to the programming memory transistor is incremented along with an increase of the number of times of programming, and therefore, in the same way as the conventional ISPP method, it is possible to perform the data programming at a high speed and with a high precision.

In addition, the two types of disturb voltage applied to the nonprogramming memory transistors designated by the selected word line and the nonselected bit lines and by the nonselected word lines and the selected bit line are incremented by the same rate as the increment of the difference of the programming voltages applied to the programming memory transistors along with an increase of the number of times of programming.

For this reason, the degradation of the disturb margin which was a problem in the conventional ISPP method can be eliminated.

Further, in the above explanation, for convenience, the explanation was mainly made of a NAND type flash memory, but apparently the present invention can be applied to other semiconductor nonvolatile memory devices performing the data programming by injecting electrons into a floating gate by the FN tunnel phenomenon.

What is claimed is:

1. A semiconductor nonvolatile memory device wherein memory elements capable of electrical programming in response to voltages applied to connected word lines and bit lines are arranged in the form of a matrix, a high first programming voltage and low second programming voltage are applied to said memory elements, and the data programming is electrically carried out for said memory elements by a difference of programming voltages between said first programming voltage and second programming voltage, said semiconductor nonvolatile memory device comprising: a means for repeatedly performing a programming operation a plurality of times via a verify read operation; and a means for setting said first programming voltage to a constant voltage value regardless of the number of times of programming and setting said second programming voltage to a variable voltage which is decremented along with an increase of the number of times of programming, so as to increment said programming voltage difference along with an increase of the number of times of programming.

2. A semiconductor nonvolatile memory device according to claim 1, wherein said first programming voltage is a boosted voltage boosted by a boosting circuit, and said second programming voltage is a divided voltage divided within a range of a power supply voltage.

3. A NAND type semiconductor nonvolatile memory device wherein a plurality of memory transistors are arranged in the form of a matrix, a plurality of NAND strings formed by a series connection of said memory transistors are connected to bit lines, the memory transistors arranged in the same row are connected to a word line, a high programming word line voltage is applied to the word line to which the memory transistors are connected, a reference bit line voltage is applied to the bit line, and the difference of programming voltages between the programming word line voltage and the reference bit line voltage is used to electrically perform the data programming for the memory transistors, said semiconductor nonvolatile memory device comprising: a means for repeatedly performing a programming operation a plurality of times via a verify read operation; and a means for setting the programming word line voltage to a constant voltage regardless of the number of times of programming and setting the reference bit line voltage to a variable voltage which is decremented along with the number of times of programming, so as to increment the programming voltage difference along with an increase of the number of times of programming.

4. A semiconductor nonvolatile memory device according to claim 3, further comprising:

a data latch circuit provided for every bit line;

a means for transferring page programming data for memory transistors connected to the selected word line to said data latch circuits; and a means for applying a programming prohibit bit line voltage set to a voltage lower than said programming word line voltage and higher than said reference bit line voltage to said data latch circuit at the time of a programming operation.

5. A semiconductor nonvolatile memory device according to claim 3, wherein said programming word line voltage is a boosted voltage boosted by a boosting circuit, and said reference bit line voltage is a divided voltage divided within the range of the power supply voltage.

6. A semiconductor nonvolatile memory device according to claim 5, wherein the generation circuit of said reference bit line voltage has a means for selecting one divided voltage from among a plurality of divided voltages divided by a plurality of resistor elements connected in series between an anode side and a cathode side of a power supply voltage so that the voltage is decremented along with an increase of the number of times of programming.

7. A semiconductor nonvolatile memory device wherein memory elements capable of electrical programming in response to the voltages applied to the connected word lines and bit lines are arranged in the form of a matrix, either of a high first programming voltage and low second programming voltage is applied to the word line and bit line to which the selected memory element is connected and the programming voltage difference between said first programming voltage and second programming voltage is used to perform the data programming for said selected memory element, and a programming prohibit voltage of a voltage lower than said first programming voltage and higher than said second programming voltage is applied to at least one of the word lines and bit lines of the nonselected memory elements to prohibit the data programming to the nonselected memory elements, said semiconductor nonvolatile memory device comprising: a means for repeatedly performing a programming operation a plurality of times via a verify read operation; and a means for setting said second programming voltage to a constant voltage regardless of the number of times of programming, and incrementing both of said first programming voltage and programming prohibit voltage along with an increase of the number of times of programming.

8. A semiconductor nonvolatile memory device according to claim 7, wherein each voltage increment of said programming prohibit voltage for every increase of number of times of programming is set to a half of each voltage increment of said first programming voltage for every increase of number of times of programming.

9. A semiconductor nonvolatile memory device wherein memory elements capable of electrical programming in accordance with voltages applied to connected word lines and bit lines are arranged in the form of a matrix, either of a high first programming voltage and low second programming voltage is applied to the word line and bit line to which a selected memory element is connected and the programming voltage difference between said first programming voltage and second programming voltage is used to perform the data programming for said selected memory element, and a programming prohibit voltage of a voltage lower than said first programming voltage and higher than said second programming voltage is applied to at least one of the word lines and bit lines of the nonselected memory elements to prohibit the data programming to the nonselected memory elements, said semiconductor nonvolatile memory device comprising: a means for repeatedly performing a programming operation a plurality of times via a verify read operation; and a means for setting said programming prohibit voltage to a constant voltage regardless of the number of times of programming, incrementing said first programming voltage along with an increase of the number of times of programming, and decrementing said second programming voltage along with an increase of the number of times of programming.

10. A semiconductor nonvolatile memory device according to claim 9, wherein each voltage increment of said first programming voltage for every increase of the number of times of programming and each voltage decrement of said second programming voltage for every increase of the number of times of programming are set to the same voltage value.

11. A semiconductor nonvolatile memory device according to claim 9, wherein said first programming voltage is a boosted voltage boosted by a boosting circuit, and said second programming voltage is a divided voltage divided within the range of a power supply voltage.

12. A NAND type semiconductor nonvolatile memory device wherein a plurality of memory transistors are arranged in the form of a matrix, a plurality of NAND strings formed by series connection of said memory transistors are connected to bit lines, the memory transistors arranged in the same row are connected to a word line, a high programming word line voltage and reference bit line voltage are applied to the word lines and bit lines to which the memory transistors are connected, the difference of programming voltages between the programming word line voltage and the reference bit line voltage is used to electrically perform the data programming for a selected memory transistor, and a programming prohibit voltage set to be lower than the programming word line voltage but higher than the reference bit line voltage is applied to at least one of the word lines and bit lines of the nonselected memory transistors to prohibit the data programming to the nonselected memory transistors, said semiconductor nonvolatile memory device comprising: a means for repeatedly performing a programming operation a plurality of number of times via a verify read operation; and a means for setting the reference bit line voltage to a constant voltage regardless of the number of times of programming, and incrementing both of the programming word line voltage and programming prohibit voltage along with an increase of the number of times of programming.

13. A NAND type semiconductor nonvolatile memory device according to claim 12, wherein each voltage increment of said programming prohibit voltage for every increase of the number of times of programming is set to a half of each voltage increment of said programming word line voltage for every increase of the number of times of programming.

14. A NAND type semiconductor nonvolatile memory device wherein a plurality of memory transistors are arranged in the form of a matrix, a plurality of NAND strings formed by a series of connection of said memory transistors are connected to bit lines, memory transistors arranged in the same row are connected to a common word line, a high programming word line voltage and reference bit line voltage are applied to the word lines and bit lines to which said memory transistors are connected and the difference of programming voltages between said programming word line voltage and said reference bit line voltage is used to electrically perform the data programming for a selected memory transistor, and a programming prohibit voltage set to be lower than said programming word line voltage but higher than said reference bit line voltage is applied to at least one of the word lines and bit lines of the nonselected memory transistors to prohibit the data programming to said nonselected memory transistors, said NAND type semiconductor nonvolatile memory device comprising: a means for repeatedly performing a programming operation a plurality of times via a verify read operation; and a means for setting said programming prohibit voltage to a constant voltage regardless of the number of times of programming, incrementing said programming word line voltage along with an increase of the number of times of programming, and decrementing said reference bit line voltage along with an increase of the number of times of programming.

15. A NAND type semiconductor nonvolatile memory device according to claim 14, wherein each voltage increment of said programming word line voltage for every increase of the number of times of programming and each voltage decrement of said reference bit line voltage for every increase of the number of times of programming are set to the same voltage value.

16. A NAND type semiconductor nonvolatile memory device according to claim 14, wherein said programming word line voltage is a boosted voltage boosted by a boosting circuit, and said reference bit line voltage is a divided voltage divided within the range of a power supply voltage.

* * * * *